(12) United States Patent
Park

(10) Patent No.: US 12,262,485 B2
(45) Date of Patent: Mar. 25, 2025

(54) DISPLAY APPARATUS AND METHOD FOR MANUFACTURING THE SAME

(71) Applicant: LG Display Co., Ltd., Seoul (KR)

(72) Inventor: Chanhyeok Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 152 days.

(21) Appl. No.: 17/992,841

(22) Filed: Nov. 22, 2022

(65) Prior Publication Data

US 2023/0217604 A1    Jul. 6, 2023

(30) Foreign Application Priority Data

Dec. 30, 2021    (KR) .................. 10-2021-0193275

(51) Int. Cl.
    *H05K 5/02*        (2006.01)
    *B32B 5/16*         (2006.01)
                (Continued)

(52) U.S. Cl.
CPC .................. *H05K 5/02* (2013.01); *B32B 5/16* (2013.01); *B32B 7/12* (2013.01); *B32B 15/18* (2013.01); *B32B 15/20* (2013.01); *B32B 27/281* (2013.01); *B32B 27/36* (2013.01); *B32B 27/365* (2013.01); *B32B 37/12* (2013.01); *B32B 38/0004* (2013.01); *B32B 15/043* (2013.01); *B32B 17/10* (2013.01); *B32B 27/08* (2013.01); *B32B 38/0008* (2013.01); *B32B 2255/06* (2013.01); *B32B 2255/205* (2013.01); *B32B 2264/105* (2013.01); *B32B 2305/026* (2013.01);
(Continued)

(58) Field of Classification Search
CPC .... H05K 5/02; B32B 5/16; B32B 7/12; B32B 15/18; B32B 15/20; B32B 27/281; B32B 27/36; B32B 27/365; B32B 37/12; B32B 38/0004; B32B 15/043; B32B 17/10; B32B 27/08; B32B 38/0008; B32B 2255/06; B32B 2255/205; B32B 2264/105; B32B 2305/026; B32B 2305/80; B32B 2307/302; B32B 2307/558; B32B 2307/732; B32B 2311/24; B32B 2311/30; B32B 2457/206
USPC ....................................................... 361/807
See application file for complete search history.

(56) References Cited

U.S. PATENT DOCUMENTS 9,530,986 B2 * 12/2016 Okumoto ............. H10K 59/879
10,083,636 B2    9/2018   Han
(Continued)

FOREIGN PATENT DOCUMENTS

DE     102014216362 A1    2/2016
DE     102022112489 A1    12/2022
(Continued)

OTHER PUBLICATIONS

German Patent and Trademark Office, Office Action, German Patent Application No. 102022130672.0, Apr. 18, 2023, 15 pages.
(Continued)

*Primary Examiner* — Timothy J Thompson
*Assistant Examiner* — Michael F McAllister
(74) *Attorney, Agent, or Firm* — Fenwick & West LLP

(57) ABSTRACT

Disclosed is a display apparatus including a display panel and a cushion plate disposed under the display panel. The cushion plate may include a porous member and a reinforcing plate. A step in a side area of the display apparatus may be removed, thereby improving impact absorption ability and rigidity.

19 Claims, 5 Drawing Sheets

(51) Int. Cl.
  *B32B 7/12*     (2006.01)
  *B32B 15/18*    (2006.01)
  *B32B 15/20*    (2006.01)
  *B32B 17/10*    (2006.01)
  *B32B 27/08*    (2006.01)
  *B32B 27/28*    (2006.01)
  *B32B 27/36*    (2006.01)
  *B32B 37/12*    (2006.01)
  *B32B 38/00*    (2006.01)
  *B32B 15/04*    (2006.01)

(52) U.S. Cl.
  CPC ..... *B32B 2305/80* (2013.01); *B32B 2307/302* (2013.01); *B32B 2307/558* (2013.01); *B32B 2307/732* (2013.01); *B32B 2311/24* (2013.01); *B32B 2311/30* (2013.01); *B32B 2457/206* (2013.01)

(56) References Cited

U.S. PATENT DOCUMENTS

| | | |
|---|---|---|
| 10,369,664 B2 * | 8/2019 | Yamazaki ......... G02F 1/136286 |
| 10,535,835 B2 | 1/2020 | Han |
| 10,915,151 B2 | 2/2021 | Silvanto et al. |
| 11,160,175 B2 | 10/2021 | Park et al. |
| 11,355,413 B2 | 6/2022 | Lee et al. |
| 11,482,137 B2 | 10/2022 | Han |
| 11,665,955 B2 * | 5/2023 | Park ..................... H10K 59/873 257/40 |
| 12,183,653 B2 | 12/2024 | Lee et al. |
| 2009/0130941 A1 * | 5/2009 | Boroson ................ H10K 50/84 445/25 |
| 2018/0053451 A1 | 2/2018 | Han |
| 2018/0374399 A1 | 12/2018 | Han |
| 2019/0036066 A1 | 1/2019 | Han |
| 2020/0211920 A1 | 7/2020 | Lee et al. |
| 2021/0068274 A1 | 3/2021 | Park et al. |
| 2022/0020956 A1 | 1/2022 | Kim |
| 2022/0246491 A1 | 8/2022 | Lee et al. |
| 2022/0394860 A1 | 12/2022 | Park et al. |
| 2023/0217604 A1 * | 7/2023 | Park ...................... G06F 1/1637 361/807 |

FOREIGN PATENT DOCUMENTS

| | | |
|---|---|---|
| EP | 4020073 A1 | 6/2022 |
| EP | 4020074 A1 | 6/2022 |
| JP | 2012-124391 A | 6/2012 |
| KR | 10-2018-0021299 A | 3/2018 |
| KR | 10-2019-0011865 A | 2/2019 |
| KR | 10-2020-0083697 A | 7/2020 |
| KR | 10-2020-0083775 A | 7/2020 |
| KR | 10-2021-0027718 A | 3/2021 |

OTHER PUBLICATIONS

Korean Intellectual Property Office, Office Action, Korean Patent Application No. 10-2021-0193275, Dec. 8, 2024, 13 pages.

* cited by examiner

DISPLAY APPARATUS AND METHOD FOR MANUFACTURING THE SAME

CROSS-REFERENCE TO RELATED APPLICATIONS

This application claims priority to and benefit of Republic of Korea Patent Application No. 10-2021-0193275 filed on Dec. 30, 2021, which is hereby incorporated by reference as when fully set forth herein.

BACKGROUND

Field

The present disclosure relates to a display apparatus, and more particularly, to a display apparatus capable of increasing rigidity and impact absorption function and improving appearance quality.

Description of Related Art

A display apparatus that displays an image on a TV, a monitor, a smart phone, a tablet PC, a laptop computer, and the like is used in various manners and forms.

Following a liquid crystal display (LCD) apparatus that has been used up to now among the display apparatuses, use and application ranges of an organic light-emitting display (OLED) apparatus are rapidly expanding.

The display apparatus includes a liquid crystal or a light-emitting element to realize the image, and includes a thin-film transistor for individually controlling an operation of each liquid crystal or light-emitting element.

Among the display apparatuses, the organic light-emitting display apparatus includes a thin-film transistor for driving a pixel and a light-emitting element that generates light by receiving a signal from the thin-film transistor.

The light-emitting element is composed of a light-emitting layer, an anode electrode for applying a voltage to the light-emitting layer, and a cathode electrode for applying a common voltage. The light-emitting layer may be disposed between the anode electrode and the cathode electrode, so that holes injected from the anode electrode move to the light-emitting layer and electrons injected from the cathode electrode move to the light-emitting layer, and the electrons and the holes are recombined with each other in the light-emitting layer to generate excitons. As a state of the exciton changes from an excited state to a ground state, fluorescent molecules of the light-emitting layer emit light to display the image.

The display apparatus includes a display area to form the image and a non-display area in which various additional components such as a flexible circuit board or a driver are disposed.

The additional components may be located in the non-display area. A thickness and a width of the display apparatus may increase due to the additional components.

The increase in the thickness and the width of the display apparatus is disadvantageous in terms of portability or design. Therefore, various technologies for reducing the thickness and the width of the display apparatus have been developed.

Further, the display apparatus may be easily damaged by an external impact due to a small thickness and a complex configuration of the display apparatus. Thus, various structures to improve rigidity and an impact absorbing function are also being developed.

SUMMARY

Components such as a light-emitting element and a thin-film transistor constituting a display apparatus are vulnerable to an impact.

When a thickness of the component is reduced or the component is modified so as to reduce a thickness and a width of the display apparatus, an impact-absorption function and rigidity of the display apparatus may be reduced.

Further, since a component disposed under a display panel may be visually recognized by a viewer through the display panel, appearance quality of the display apparatus may be deteriorated.

A purpose of the present disclosure is to improve the impact-absorption function, the rigidity, and the appearance quality while reducing the thickness and the width of the display apparatus.

Purposes of the present disclosure are not limited to the above-mentioned purpose. Other purposes and advantages of the present disclosure that are not mentioned may be understood based on following descriptions, and may be more clearly understood based on embodiments of the present disclosure. Further, it will be easily understood that the purposes and advantages of the present disclosure may be realized using means shown in the claims and combinations thereof.

According to an embodiment of the present disclosure, a display apparatus includes a display panel for displaying an image, and a cushion plate disposed under the display panel, wherein the cushion plate includes a porous member, a first reinforcing plate, and a first adhesive member, wherein distal ends of the display panel and the cushion plate coincide or are aligned with each other.

According to an embodiment of the present disclosure, a method for manufacturing a display apparatus includes providing a first reinforcing plate having first and second surfaces opposite to each other, placing a precursor of a porous member containing metal powders on the first surface of the first reinforcing plate, sintering the precursor of the porous member to form a porous member disposed on the first reinforcing plate, placing an adhesive member on the second surface of the first reinforcing plate, placing a display panel on the first adhesive member, and cutting a portion of a side area of each of the display panel and the porous member at once using a laser device.

According to another embodiment of the present disclosure, a display panel including a display area and a non-display area, the display area of the display panel including a pixel array for displaying an image, and a cushion plate disposed under the display panel, wherein the cushion plate includes a porous member formed with a plurality of pores, at least a first reinforcing plate on the porous member, the first reinforcing plate including a metal material, and an adhesive member on the first reinforcing plate, wherein for at least one side of the display apparatus, a side surface of the display panel and a side surface of the cushion plate are aligned with one another.

Specific details of other embodiments are included in the detailed description and the drawings.

According to an embodiment of the present disclosure, the cushion plate disposed under the display panel is composed of the porous member. Thus, the impact-absorption function may be improved while reducing the thickness of the display apparatus.

Further, by disposing the first reinforcing plate on the porous member, the rigidity of the display apparatus may be improved, and it is possible to prevent a unevenness surface of the porous member from being visually recognized by the viewer in front of the display apparatus through the display panel, so that the appearance quality of the display apparatus may be improved.

Moreover, the distal ends of the display panel and the cushion plate coincide and aligned with each other such that there is no portion protruding outwardly beyond the display panel, thereby reducing the damage of the display panel due to external impact.

Effects of the present disclosure are not limited to the above-mentioned effects, and other effects as not mentioned will be clearly understood by those skilled in the art from following descriptions.

DETAILED DESCRIPTION OF EMBODIMENTS

Figure 1A:
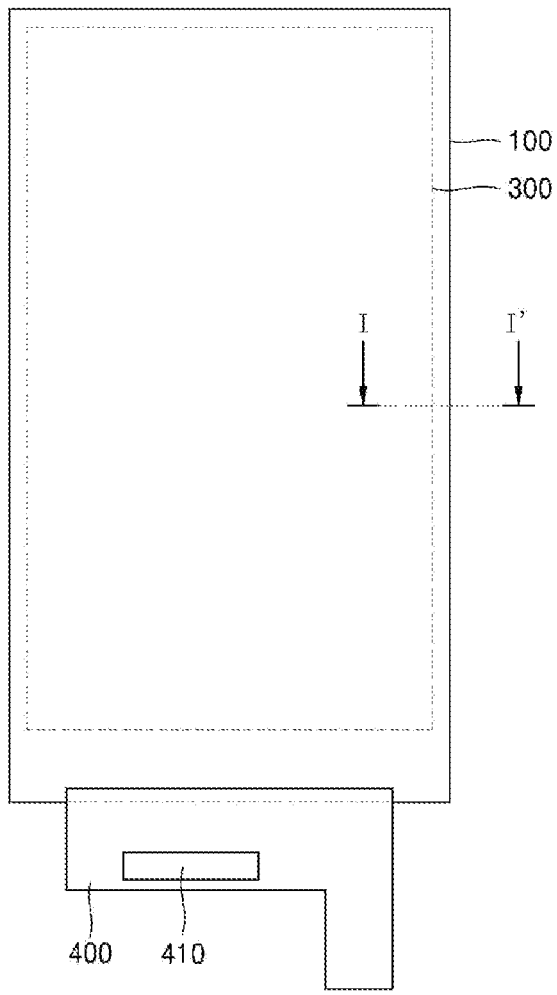
FIG. 1A is a plan view according to an embodiment of the present disclosure.

Advantages and features of the present disclosure, and a method of achieving the Advantages and features will become apparent with reference to embodiments described later in detail together with the accompanying drawings. However, the present disclosure is not limited to the embodiments as disclosed below, but may be implemented in various different forms. Thus, these embodiments are set forth only to make the present disclosure complete, and to completely inform the scope of the disclosure to those of ordinary skill in the technical field to which the present disclosure belongs, and the present disclosure is only defined by the scope of the claims.

A shape, a size, a ratio, an angle, a number, etc. disclosed in the drawings for describing the embodiments of the present disclosure are exemplary, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is directed to the purpose of describing particular embodiments only and is not intended to be limiting of the present disclosure. As used herein, the singular constitutes "a" and "an" are intended to include the plural constitutes as well, unless the context clearly indicates otherwise. It will be further understood that the terms "comprise", "comprising", "include", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list. In interpretation of numerical values, an error or tolerance therein may occur even when there is no explicit description thereof.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after", "subsequent to", "before", etc., another event may occur therebetween unless "directly after", "directly subsequent" or "directly before" is indicated.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The features of the various embodiments of the present disclosure may be partially or entirely combined with each other, and may be technically associated with each other or operate with each other. The embodiments may be implemented independently of each other and may be implemented together in an association relationship.

As used herein, the term "substantially," "about," and similar terms are used as terms of approximation, and are intended to account for inherent deviations in measured or calculated values that would be recognized by those of ordinary skill in the art. The term may be used to prevent unauthorized exploitation by an unauthorized infringer to design around accurate or absolute figures provided to help understand the present disclosure.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, a top or upward direction may refer to a +Z-axis direction, and a bottom or downward direction may refer to a −Z-axis direction.

Moreover, in a plan view of a display apparatus, an upper side surface or an upper side, a lower side surface or a lower side, a left side surface or a left side, and a right side surface or a right side may be defined on a plane defined by X-axis and Y-axis directions perpendicular to the Z axis direction. A side area is an area including certain areas of the upper side, lower side, left side, and right side.

A distal end or a distal end area may refer to an end portion itself, or an area extending from the end portion by to a certain amount. A distal end and a side portion may be used interchangeably. However, the present disclosure is not limited to the terms.

A display apparatus of the present disclosure may be applied to an organic light-emitting display apparatus, but may not be limited thereto, and may be applied to various display apparatuses such as an LED display apparatus or a quantum dot display apparatus.

Hereinafter, with reference to the drawings, the present disclosure will be described.

FIG. 1A is a plan view according to an embodiment of the present disclosure.

Figure 1B:
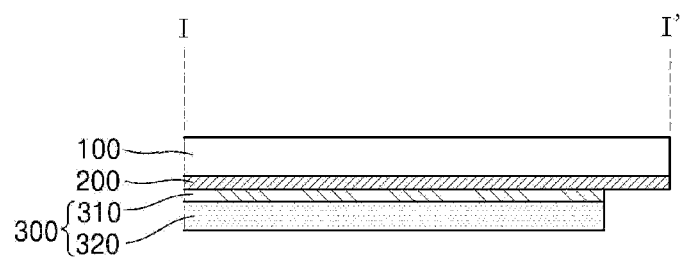
FIG. 1B is a cross-sectional view taken along a line I-I' in FIG. 1A according to an embodiment of the present disclosure.

FIG. 1B is a cross-sectional view taken along a line I-I' in FIG. 1A according to an embodiment of the present disclosure.

Referring to FIG. 1A and FIG. 1B, a display apparatus 10 may include various components such as a display panel 100, a support member 200, and a cushion plate 300.

The display panel 100 may include a display substrate made of a polymer, a plastic such as polyimide (PI), or a glass. The display substrate may include a display area for displaying an image and a non-display area. A pixel array for displaying an image may be arranged in the display area. The pixel array may include a plurality of sub-pixels and a driver circuit for driving the plurality of sub-pixels.

The non-display area, which is an area surrounding the display area, may be an area in which the image is not displayed.

A bezel may be the non-display area surrounding the display area in a product to which the display apparatus 10 is applied. The non-display area and the bezel of the display apparatus 10 may be the same area. The present disclosure is not limited thereto.

A flexible circuit board 400 or a driver 410 may be disposed on or connected to the non-display area of the display panel 100.

According to an embodiment of the present disclosure, a scheme in which the flexible circuit board 400 or the driver 410 is disposed on or connected to the non-display area of the display panel 100 may include a chip on film (COF) scheme in which the flexible circuit board 400 on which the driver 410 is mounted is connected to the non-display area of the display panel 100, or a chip on plastic (COP) scheme in which the driver 410 is directly mounted on the display panel 100. The scheme in which the flexible circuit board 400 or the driver 410 is disposed on or connected to the non-display area of the display panel 100 may not be limited thereto, and may include various schemes.

One distal end of the flexible circuit board 400 may be connected to the non-display area of the display panel 100. The flexible circuit board 400 may be bent so that the other distal end thereof is disposed on a back surface of the display panel 100. Thus, the non-display area of the display panel 100 which may be visible in a frontward direction may be reduced.

Further, a distal end of the display panel 100 on which the flexible circuit board 400 is mounted may be bent by a certain amount along with the flexible circuit board 400, so that the non-display area of the display panel 100 which may be visible in the frontward direction may be further reduced.

In order to reduce the non-display area of the display panel 100 visible in the frontward direction as much as possible, one distal end of the display panel 100 may be bent so as to be disposed on the back surface of the display panel 100.

In a state in which the flexible circuit board 400 or the display panel 100 is bent, the driver 410 may be disposed under the display substrate.

A radius of curvature by which the display panel 100 or the flexible circuit board 400 is bent increases as a thickness of the display apparatus 10 increases. As the radius of curvature of the display panel 100 or the flexible circuit board 400 increases, the non-display area increases.

Therefore, by reducing the thickness of the display apparatus 10, the radius of curvature of the flexible circuit board 400 or the display panel 100 may be reduced, and the non-display area may be reduced.

The support member 200 may be optionally disposed under the display panel 100.

The support member 200 may be disposed under the display substrate so as to supplement the rigidity of the display substrate. The support member 200 may be formed to have a certain strength and thickness to supplement the rigidity of the display substrate.

The support member 200 may be made of a plastic material such as PET (polyethylene terephthalate), PC (polycarbonate), and PI (polyimide). The present disclosure is not limited thereto.

The cushion plate 300 may be disposed under the support member 200.

The cushion plate 300 has a heat-dissipation function and an impact absorption function, and may include a first adhesive member 310 and a porous member 320. The first adhesive member 310 and the porous member 320 may be stacked in order in a downward direction from the display panel 100.

In another embodiment of the present disclosure, the cushion plate may be formed by stacking a plurality of layers having various functions, such as a heat-dissipation layer having a heat-dissipation function, a lift-off prevention layer to prevent lifting of the heat-dissipation layer, a cushion layer capable of absorbing the impact, and an adhesive layer for bonding the cushion layer and the heat-dissipation layer to each other.

A structure of the cushion plate including the heat-dissipation layer, the lift-off prevention layer, the cushion layer, and the adhesive layer is thicker than a structure of the cushion plate including only the porous member 320. Further, when each of the heat-dissipation layer and the cushion layer is thickened to increase the heat-dissipation function and the impact absorption function, the radius of curvature of a bent area of the flexible circuit board 400 or the display panel 100 increases by increase in the thickness, such that the non-display area is increased.

Therefore, the cushion plate 300 may include the thin porous member 320 having both the heat-dissipation function and the impact absorbing function.

The porous member 320 may be composed of a single structure rather than a stack structure of the heat-dissipation layer and the cushion layer, and thus may have a small thickness, and may have both a heat-dissipation function and an impact absorption function.

The cushion plate 300 including the porous member 320 may further include the first adhesive member 310 for bonding the cushion plate 300 to the support member 200.

The cushion plate 300 may have a smaller size than a size of each of the display panel 100 and the support member 200, and may be attached to a back surface of the support member 200 via the first adhesive member 310.

The cushion plate 300 may be larger in the size than each of the display panel 100 and the support member 200. However, when the cushion plate 300 is larger in the size than the display panel 100, the non-display area may increase.

Therefore, in order not to increase the non-display area of the display apparatus 10, a distal end of the porous member 320 may be disposed inwardly of a distal end of each of the display panel 100 and the support member 200, or a the porous member 320 may be smaller than the support member 200 while being disposed in the bent area where the circuit board 400 and the display panel 100 are bent.

When the cushion plate 300 is smaller than the support member 200, a weight thereof may be reduced and a manufacturing cost thereof may be reduced, while the heat-dissipation and impact absorption function thereof may be lowered.

Moreover, a step may be formed between the cushion plate 300 and the display panel 100, and thus the display panel 100 may be easily damaged.

Referring to FIG. 1B, the step in the cross-sectional view of the display apparatus 10 may be a portion formed in a stepped shape when each of the display panel 100 and the support member 200 protrudes outwardly beyond the cushion plate 300.

In a distal end area or a side portion of the display panel 100 where the step is formed, the display panel 100 protrudes outwardly beyond the cushion plate 300 while the display panel 100 is not supported on the cushion plate 300. Thus, when an external impact is applied thereto, the distal end of the display panel 100 is easily may be damaged. For this reason, the step may be removed to prevent the damage. This will be described below.

Figure 2A:
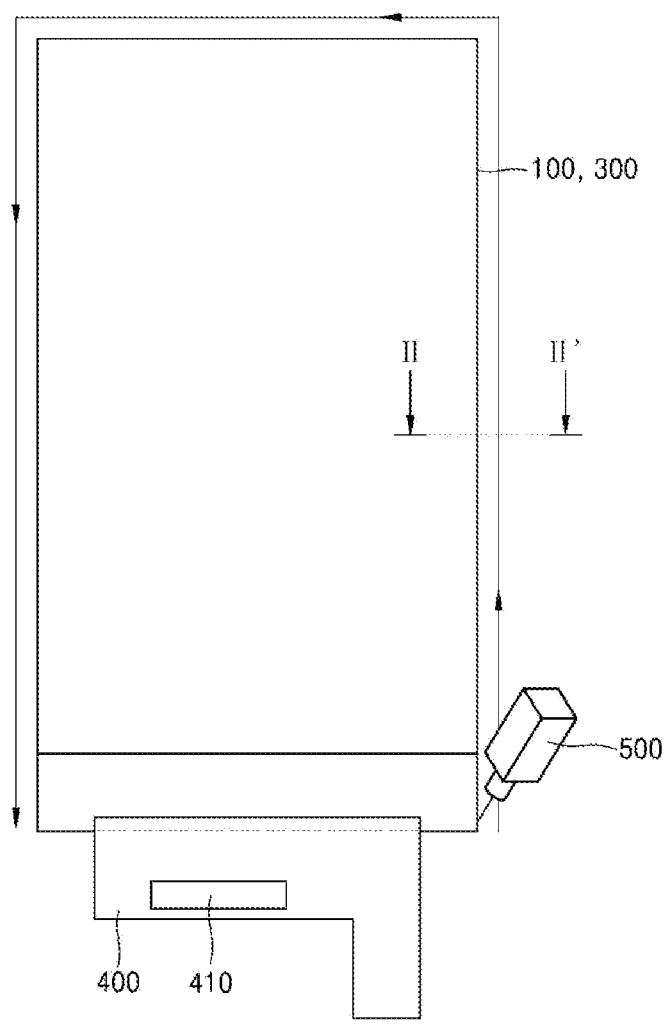
FIG. 2A is a plan view according to another embodiment of the present disclosure.

FIG. 2A is a plan view according to another embodiment of the present disclosure.

Figure 2B:
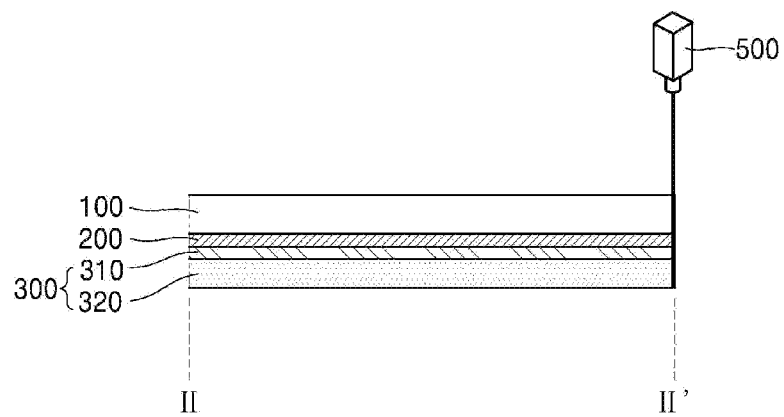
FIG. 2B is a cross-sectional view taken along a line II-II' in FIG. 2A according to an embodiment of the present disclosure.

FIG. 2B is a cross-sectional view taken along a line II-II' in FIG. 2A according to an embodiment of the present disclosure.

Referring to FIG. 2A and FIG. 2B, a structure in which corresponding side surfaces of the display panel 100, the support member 200, and the cushion plate 300 are aligned with each other is shown. For example, this is a structure in which the step formed in the stacked structure of the display panel 100, the support member 200 and the cushion plate 300 is removed.

In order to remove a step of the display apparatus 10, the step may be removed in a method of attaching the cushion plate 300 to the support member 200 located beneath the display panel 100 and then cutting a portion of a distal end of the display apparatus 10 using a laser device 500. The method for removing the step of the display apparatus 10 may not be limited thereto, and various methods may be applied. This may solve the problem that when the display panel 100 protrudes beyond the cushion plate, the distal end of the display panel 100 may be easily damaged when an external impact is applied thereto.

In the display apparatus 10 from which the portion of the distal end thereof is removed, corresponding distal ends of the display panel 100, the support member 200, and the cushion plate 300 may coincide with each other.

For example, when the portions of the distal ends of the display panel 100, the support member 200, and the cushion plate 300 are cut together, the distal end of the display apparatus 10 may have a straight shape without the step. Therefore, planar sizes of the display panel 100 and the cushion plate 300 may be the same.

The display panel 100 includes the optical film, the encapsulation portion, the pixel array, and the display substrate. Thus, when the portion of the distal end of the display panel 100 is cut, corresponding distal ends of the optical film, the encapsulation portion, the display substrate, the support member 200, and the cushion plate 300 may coincide with each other.

In order to remove the step of the display apparatus 10, the portions of the distal ends of the display panel 100 and the support member 200 except for the cushion plate 300 may be removed. Because the cushion plate 300 is not cut away, distal ends of the display panel 100 and the support member 200 may be aligned with each other while protruding outwardly beyond the cushion plate 300 by a certain amount.

That is, only the portions of the distal ends of the display panel 100 and the support member 200 are cut away with the laser device 500 such that the distal ends of the display panel 100 and the support member 200 protrude outwardly beyond the cushion plate 300 by the certain amount. In this case, the distal ends of the display panel 100, the support member 200 and the cushion plate 300 may substantially aligned with each other. It may be considered that the distal ends of the display panel 100, the support member 200 and the cushion plate 300 may substantially coincide with each other or are aligned with each other when the certain amount is within an error range of 5 µm. For example, a roughness (e.g., measured by root mean squared (RMS)) across a side surface of the display panel 100, a side surface of the support member 200, and a side surface of the cushion plate 300 may be equal to or less than 5 µm. As another example, a difference between a protruding side surface of the display panel 100, a side surface of the support member 200, and a side surface of the cushion plate 300 may be smaller than or equal to 5 µm relative to a side surface of the remaining components.

Even when the corresponding side surfaces of the display panel 100, the support member 200, and the cushion plate 300 are substantially aligned with each other in the display apparatus 10 while the display panel 100 protrudes outwardly beyond the cushion plate 300 by an amount within a range, for example, smaller than or equal to 5 μm, the impact-absorption effect may be similar to that in the case in which the distal ends thereof exactly coincide with each other.

At least three side surfaces of the display panel 100, at least three side surfaces of the support member 200, and at least three side surfaces of the cushion plate 300 may coincide with each other or be aligned with each other in the display apparatus 10, respectively. Because the flexible circuit board 400 is connected to the bent area formed at a lower side of the display panel 100, it may be difficult to cut a portion of the display panel 100 at the lower side thereof. Therefore, at least one of an upper side surface, a left side surface, and a right side surface except for a lower side surface of the display apparatus 10, at least one of an upper side surface, a left side surface, and a right side surface except for a lower side surface of the cushion plate 300, and at least one of an upper side surface, a left side surface, and a right side surface except for a lower side surface of the support member 200 may be aligned with each other by partially cutting at least one of an upper side, a left side, and a right side except for a lower side of each of the display apparatus 10.

Figure 3:
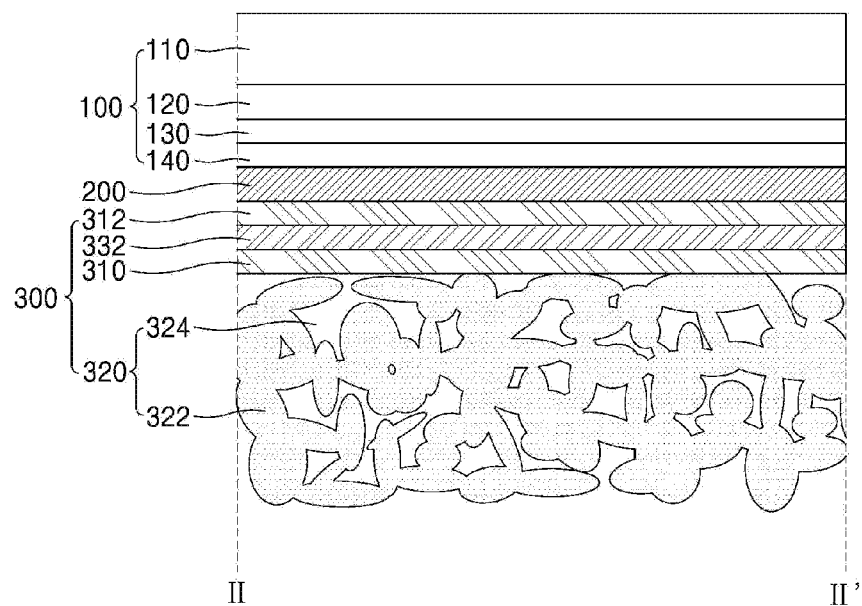
FIGS. 3 to 6 are cross-sectional views taken along a line II-II' in FIG. 2A and show another embodiment of the present disclosure.

FIG. 3 is a cross-sectional view taken along a line II-If of FIG. 2A, and shows another embodiment of the present disclosure.

FIG. 3 shows a stack structure of the display panel 100 and the cushion plate 300 of FIG. 2A.

The display panel 100 includes an optical film 110, an encapsulation portion 120, a pixel array 130, and a display substrate 140 which are sequentially stacked in a direction from top to bottom.

The display substrate 140 may be made of a polymer or plastic such as polyimide (PI), or glass. The present disclosure is not limited thereto.

The pixel array 130 may be disposed on the display substrate 140. The pixel array 130 may include a plurality of sub-pixels for displaying an image and a driver circuit for driving the plurality of sub-pixels. The driver circuit may include a thin-film transistor layer including a gate electrode, an active layer, a source electrode, and a drain electrode. A light-emitting element may be disposed on the thin-film transistor layer. A sub-pixel includes a light-emitting element. The light-emitting element may include a first electrode, a light-emitting layer, and a second electrode. The light-emitting element may be disposed to correspond to the display area of the substrate. The light-emitting element may emit light by means of a high-potential data voltage supplied to the second electrode via the driving thin-film transistor and a low-potential common voltage supplied to the first electrode. The light generated from the light-emitting element may be emitted in a forward direction to realize a desired image.

The encapsulation portion 120 may be disposed on the light-emitting element. The encapsulation portion 120 may protect the thin-film transistor layer and the light-emitting element from external impact, and may prevent penetration of oxygen or moisture into the thin-film transistor layer and the light-emitting element. The encapsulation portion 120 may include at least one inorganic film and organic film. The present disclosure is not limited thereto.

The optical film 110 may be additionally disposed on the encapsulation portion 120. The optical film 110 may have a form in which one or more function layers are stacked. The present disclosure is not limited thereto.

For example, the optical film 110 may include an anti-reflection layer such as a polarizing film that may prevent reflection of external light to improve outdoor visibility and contrast of the image displayed on the display panel 100.

In another example, the optical film 110 may further include a barrier layer to prevent penetration of moisture or oxygen. The barrier layer may be made of a material with low moisture permeability, such as a polymer material.

A cover member may be arranged on a front surface of the display panel 100. The cover member may cover the front surface of the display panel 100 to protect the display panel 100 from external impact.

The display panel 100 displays the image through the front surface of the cover member. Because the cover member overlaps the display area displaying the image, the cover member may be made of a transparent material such as cover glass to display the image therethrough. For example, the cover member may be made of a transparent plastic material, a glass material, or a reinforced glass material. The present disclosure is not limited thereto.

The pixel array 130 includes a plurality of sub-pixels. Each of the plurality of sub-pixels may be an individual unit emitting light, and the light-emitting element may be disposed in each of the plurality of sub-pixels. The plurality of sub-pixels may include a red sub-pixel, a green sub-pixel, and a blue sub-pixel. In another example, the plurality of sub-pixels may include a red sub-pixel, a green sub-pixel, a blue sub-pixel, and a white sub-pixel. However, the present invention is not limited thereto.

In order to drive the plurality of sub-pixels, the driving circuit composed of various thin-film transistors and storage capacitors, and a signal line may be included. For example, the driving circuit may be composed of various components such as the driving thin-film transistor, a switching thin-film transistor, a storage capacitor, and the like. Moreover, the signal line may include a gate line and a data line. The present disclosure is not limited thereto.

The driver 410 generates a data signal and a gate control signal based on image data and a timing synchronization signal supplied from an external host driving system. Moreover, the driving circuit may supply the data signal to the data line of each pixel via a display pad, and may supply the gate control signal to the gate driving circuit.

Because the driver 410 generates high-temperature heat, it may be necessary to effectively impart a heat-dissipation effect to the driver 410. For example, the heat from the driver 410 may be effectively dissipated via the cushion plate 300. Because the cushion plate 300 is located between the display panel 100 and the driver 410, the cushion plate 300 effectively dissipate the heat generated from the display panel 100 as well as the driver 410.

The cushion plate 300 disposed under the display panel 100 may include the porous member 320, the first adhesive member 310, a first reinforcing plate 332, and a second adhesive member 312.

The porous member 320 may include a metal structure 322 having a metal as a main component, and a plurality of pores 324 disposed inside the metal structure 322. For example, the metal structure 322 may be made of the metal as a main component. The porous member 320 may be a porous metal structure having the plurality of pores 324 therein. The porous member 320 may be embodied as a metal foam.

The metal structure 322 which has the metal as its main component may dissipate the high-temperature heat generated from the display panel 100 or the driver 410. The heat-dissipation function may be further improved due to the pores 324 formed inside the porous member 320. Further, since the porous member has a cushion function due to the pores 324 inside the metal structure 322, the porous member 320 may effectively absorb the impact applied externally. For example, the pores 324 inside the metal structure 322 may have an excellent impact absorption function of instantaneous impact applied from the outside.

A porosity of the porous member 320 having the plurality of pores 324 may be in a range of 40 to 80%, and a size of each hole may be in a range of 20 to 25 μm. When the porosity is lowered, the rigidity may be increased, but the heat-dissipation effect may be lowered. Conversely, when the porosity increases, the heat-dissipation effect increases, but it may become difficult to maintain the desired rigidity. The porosity may refer to a ratio of an area occupied by the plurality of pores 324 to a unit area in the porous member 320.

The porous member 320 may be formed, for example, in a following manufacturing manner. The present disclosure is not limited thereto.

The porous member 320 may be formed by sintering a precursor of the porous member containing a metal powder.

The precursor of the porous member refers to a precursor before proceeding with a process, such as the sintering, performed to form the porous member 320.

For example, the precursor of the porous member may be formed using a slurry containing a metal powder, a dispersant, and a binder.

The metal powder may be a metal powder in which one or more metal powders among a copper powder, a nickel powder, an iron powder, a SUS powder, a molybdenum powder, a silver powder, a platinum powder, a gold powder, an aluminum powder, a chromium powder, an indium powder, a tin powder, a magnesium powder, a phosphorus powder, a zinc powder, and a manganese powder are mixed, or a powder of an alloy of one or more metals, but may not be limited thereto.

The dispersant may, for example, use alcohol, but may not be limited thereto.

In this case, the alcohol may use monohydric alcohol having 1 to 20 carbon atoms, such as methanol, ethanol, propanol, pentanol, octanol, ethylene glycol, propylene glycol, pentanol, 2-methoxyethanol, 2-ethoxyethanol, 2-butoxyethanol, glycerol, texanol, or terpineol, dihydric alcohol having 1 to 20 carbon atoms, such as ethylene glycol, propylene glycol, hexanediol, octanediol, or pentanediol, or polyhydric alcohol, but may not be limited thereto.

A type of binder may not be particularly limited, and may be selected based on a type of the metal component or the dispersant used in preparing the slurry.

For example, the binder may use alkyl cellulose having an alkyl group having 1 to 8 carbon atoms, such as methyl cellulose or ethyl cellulose, polyalkylene carbonate having an alkylene unit having 1 to 8 carbon atoms, such as polypropylene carbonate or polyethylene carbonate, or a polyvinyl alcohol-based binder, such as polyvinyl alcohol or polyvinyl acetate, but may not be limited thereto.

After forming the slurry to contain the metal powder, the dispersant, and the binder as described above, the slurry may be injected into a mold having a predetermined shape or coated on a substrate to form the precursor of the porous member.

The precursor of the porous member may be formed into the porous member 320 via the sintering process.

The first reinforcing plate 332 may be disposed on the porous member 320.

The first reinforcing plate 332 may be connected to the porous member 320 via the first adhesive member 310.

The first adhesive member 310 having a certain thickness may be stacked on one surface of the porous member 320, so that the first reinforcing plate 332 may be directly attached or fixed to the porous member 320 via the first adhesive member 310.

The first adhesive member 310 may include an adhesive having a flat shape including an adhesive component, or an adhesive having an embossed pattern to prevent air bubbles from being generated. The first adhesive member 310 is not limited thereto, and may be made of various materials and may have various shapes.

The first reinforcing plate 332 may be formed in a form of a metal plate or a metal sheet including a component such as stainless steel (SUS), copper (Cu), aluminum (Al), and amorphous alloy.

The stainless steel (SUS) has high strength, elasticity, and corrosion resistance. Thus, the plate 332 made of SUS may have sufficient rigidity and elasticity while having a small thickness.

Moreover, the amorphous alloy may be a metal material having an aperiodic atomic arrangement structure. An amorphous alloy may be an alloy having superior properties, such as high strength, corrosion resistance, wear resistance, and non-magnetic properties, compared to a crystalline alloy. In an embodiment of the present disclosure, the first reinforcing plate 332 may be made of the amorphous alloy including nickel (Ni), silicon (Si), and boron (B). The present disclosure is not limited thereto.

When the first reinforcing plate 332 is made of the amorphous alloy, the first reinforcing plate 332 has high strength and non-magnetic characteristics, and thus has the effect of stably driving the display panel 100 operating based on an electrical signal as well as of improving rigidity.

The first reinforcing plate 332 improves the rigidity of the porous member 320, and may block and disperse the impact applied to the porous member 320.

A momentary impact may be strongly applied to the display apparatus 10 in a short moment, for example, when the user drops the display apparatus 10 from a high place or a heavy object falls onto the display apparatus 10. In this regard, the porous member 320 having the pores 324 formed therein and thus acting as a foam may absorb the impact. However, when push impact in which a force continuously presses the display apparatus 10 for a certain period of time is applied to the porous member 320, a shape of the porous member 320 may be permanently deformed, and the impact absorption function thereof may be lost.

Therefore, in order to increase the rigidity of the porous member 320 against the push impact, the first reinforcing plate 332 may be placed.

The first reinforcing plate 332 is composed of a metal plate or metal sheet, and has rigidity and elasticity. The first reinforcing plate 332 may block the push impact transmitted to the porous member 320. When the push impact disappears, the first reinforcing plate 332 may allow the shape of the porous member 320 to be restored within a short time.

Further, when the first reinforcing plate 332 is disposed on the top surface of the porous member 320, the first reinforcing plate 332 may prevent the surface irregularities of the porous member 320 from being visually recognized by the viewer in front of the display apparatus 10, so that the appearance quality of the display apparatus may be improved.

When the first reinforcing plate 332 is made of a metal such as copper (Cu) or aluminum (Al) with high electrical conductivity, the electrical conductivity of the porous member 320 may be improved, so that the discharge function for dispersing electric charges or electric field may be improved.

The second adhesive member 312 may be disposed on the first reinforcing plate 332 to connect, attach, or fix the first reinforcing plate 332 to which the porous member 320 has been coupled to the support member 200 or the display panel 100.

In the same manner as the first adhesive member 310, the second adhesive member 312 may include an adhesive component and may be formed to have a certain thickness or may include an adhesive having an embossed pattern. The second adhesive member 312 is not limited thereto, and may be made of various materials and may have various shapes.

A side area portion of each of the cushion plate 300 including the first reinforcing plate 332, the display panel 100, and the support member 200 may be cut with the laser device 500 to prevent the damage to the side surface of the display panel 100. Since the first reinforcing plate 332 is composed of a metal plate or a metal sheet, it is not easy to cut the first reinforcing plate 332, compared to the porous member 320 with a large number of pores 324, the support member 200 mainly composed of the plastic material, and the display panel 100.

Therefore, the first reinforcing plate 332 may be formed to have a thickness smaller than or equal to a certain thickness and thus may be cut with the laser device 500.

For example, when the first reinforcing plate 332 is made of stainless steel (SUS) material, the first reinforcing plate 332 may have a small thickness of 30 μm or smaller. Thus, the first reinforcing plate 332 together with the display panel 100 and the porous member 320 may be cut with the laser device 500.

When the first reinforcing plate 332 is formed to have the thickness greater than 30 μm, the rigidity thereof may be further increased, but it may become difficult to cut the first reinforcing plate 332 with the laser device 500.

Therefore, a plurality of thin reinforcing plates, each having the thickness of 30 μm or smaller, may be stacked to constitute the first reinforcing plate 332 such that the stack may be easily cut with the laser device 500 while the rigidity of the first reinforcing plate 332 is improved.

Figure 4:
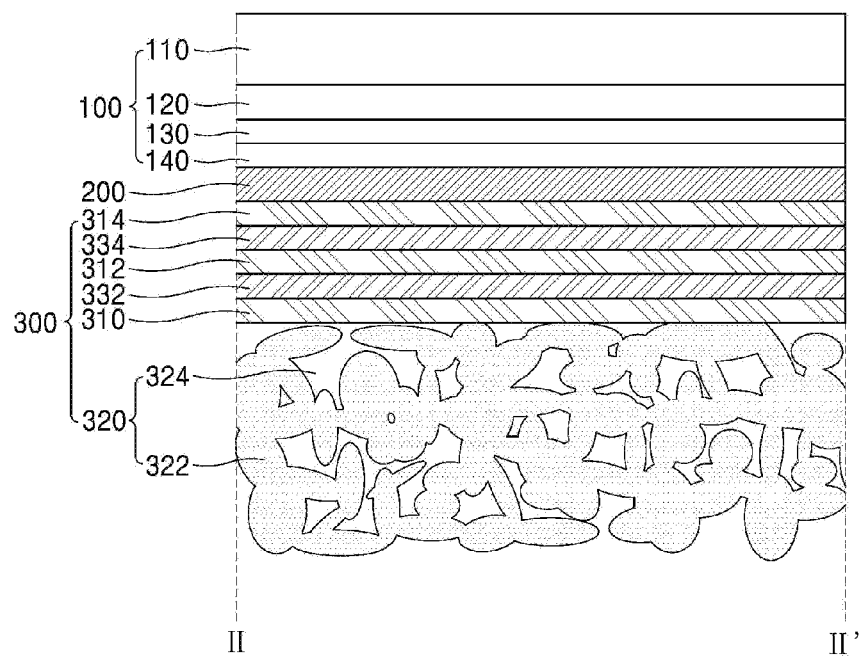

FIG. 4 is a cross-sectional view taken along the line II-II' of FIG. 2A and shows still another embodiment of the present disclosure.

Referring to FIG. 4, the cushion plate 300 may further include a second reinforcing plate 334 disposed on the first reinforcing plate 332.

Accordingly, the display apparatus 10 may include the porous member 320, the first adhesive member 310, the first reinforcing plate 332, the second adhesive member 312, the second reinforcing plate 334, and a third adhesive member 314. A configuration of the display apparatus 10 is not limited thereto. A reinforcing plate may be added thereto.

The first reinforcing plate 332 may be thin so that the plate 332 may be cut with the laser device 500. Thus, when the push impact above a certain force is applied thereto, the first reinforcing plate 332 may be deformed significantly. Thus, the push impact may be transmitted to the porous member 320.

For example, when the user carries the display apparatus 10 in a back pocket of pants or carries the same in a bag, the display apparatus 10 may have greater push impact applied thereto. Under the configuration including only the first reinforcing plate 332, it may be difficult to prevent the push impact from being transmitted to the porous member 320.

Accordingly, the second reinforcing plate 334 may be additionally disposed on the first reinforcing plate 332. The second reinforcing plate 334 may be connected, fixed, or attached to the first reinforcing plate 332 via the second adhesive member 312 disposed on the first reinforcing plate 332. When a plurality of reinforcing plates are disposed, a function of dispersing the push impact may be greatly improved.

For example, even when greater push impact is applied to the second reinforcing plate 334 such that a shape of the second reinforcing plate 334 is greatly deformed, the impact is dispersed or blocked again by the first reinforcing plate 332, so that the push impact may be prevented from being transmitted to the porous member 320.

The second reinforcing plate 334 may be formed in a form of a metal plate or a metal sheet, including a component such as stainless steel (SUS), copper (Cu), aluminum (Al), and an amorphous alloy, in the same way as the first reinforcing plate 332.

A thickness of the second reinforcing plate 334 may be so small such that the plate 334 may be cut with the laser device 500.

For example, when the second reinforcing plate 334 is made of stainless steel (SUS) material, the second reinforcing plate 334 may have a thickness of 30 μm or smaller, so that the plate 334 may be cut with the laser device 500.

The third adhesive member 314 may be disposed on the second reinforcing plate 334 and may connect, attach, or fix the second reinforcing plate 334 to the support member 200 or the display panel 100. The third adhesive member 314 may be formed in the same structure as that of the first adhesive member 310. The present disclosure is not limited thereto.

When a plurality of reinforcing plates are provided, the rigidity and the function of dispersing the impact may be improved, but the display apparatus 10 becomes thicker such that the radius of curvature of the bent portion of the flexible circuit board 400 or the display panel 100 becomes large, and thus the non-display area may be increased.

In order to increase the rigidity while thinning the cushion plate 300, a structure in which the first adhesive member 310, the second adhesive member 312, and the second reinforcing plate 334 are omitted may be applied.

Figure 5:
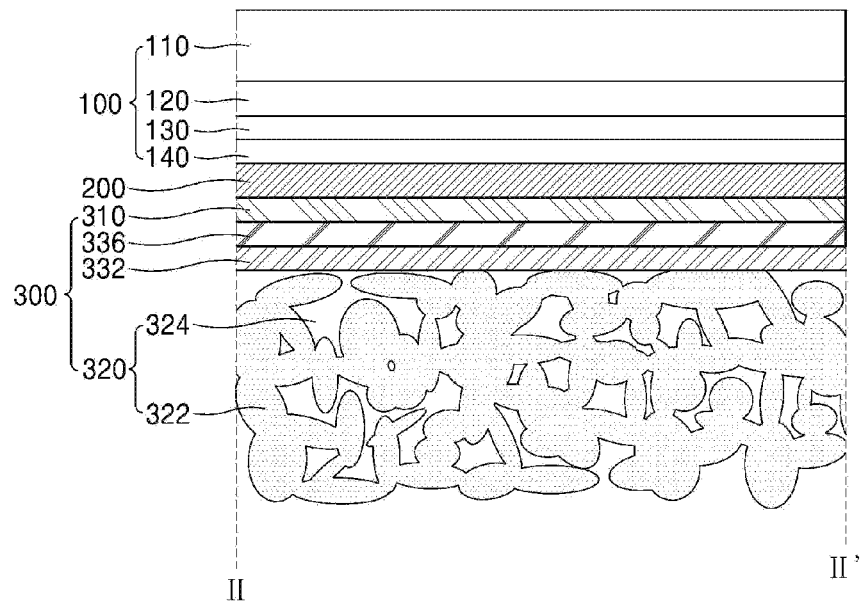

FIG. 5 is a cross-sectional view taken along the line II-II' of FIG. 2A and shows still yet another embodiment of the present disclosure.

Referring to FIG. 5, the first reinforcing plate 332 may be directly placed on, connected to, fixed to, or attached to a top surface of the porous member 320.

For example, the first reinforcing plate 332 may be integrally formed with the porous member 320 and may be disposed on a top surface of the porous member 320. The first reinforcing plate 332 may be in direct contact with the top surface of the porous member 320. The first reinforcing plate 332 and the porous member 320 may be integrally formed while an adhesive member is absent therebetween.

When the porous member 320 is formed on the first reinforcing plate 332, the porous member 320 and the first reinforcing plate 332 may be integrally formed with each other and be monolithic with each other. In order to integrally form the porous member 320 and the first reinforcing plate 332 with each other such that porous member 320 and the first reinforcing plate 332 may be monolithic with each other, a precursor of the porous member including metal powders may be disposed on the first reinforcing plate 332, and then the precursor of the porous member may be sintered. Thus, an integral and monolithic structure between the first reinforcing plate 332 and the porous member 320 may be formed.

To sinter the porous member precursor on the first reinforcing plate 332, two curing processes may be performed. A first curing process may be a provisional curing process for aligning and fixing positions of the porous member precursor and the first reinforcing plate 332 with each other. The provisional curing process may include applying heat of about 100° C. to the porous member precursor to temporarily align and fix the positions of the porous member precursor and the first reinforcing plate 332 with each other. The two curing processes and a curing scheme do not limit a scope of the present disclosure.

The second curing process may refer to a main curing process to sinter the porous member precursor on the first reinforcing plate 332 to produce the porous member 320. This main curing process may include a process of applying heat of about 800 to 1000° C. to the precursor of the porous member to finally form the porous member 320.

Thus, the integral and monolithic structure between the porous member 320 and the first reinforcing plate 332 may be formed.

Moreover, the first adhesive member 310 may be disposed on the first reinforcing plate 332 to connect the first reinforcing plate 332 to the support member 200 or the display panel 100. The first adhesive member 310 according to an embodiment of the present disclosure may be the bottommost adhesive member.

Therefore, in the embodiments of FIG. 3 and FIG. 4, the first adhesive member 310 is disposed between the porous member 320 and the first reinforcing plate 332, whereas in the embodiment of FIG. 5, the first adhesive member 310 is disposed between the support member 200 and the first reinforcing plate 332. The first adhesive members 310 disclosed in the embodiments of FIG. 3, FIG. 4, and FIG. 5 may be made of the same material. Further, the first adhesive member 310, the second adhesive member 312, and the third adhesive member 314 disclosed in the present disclosure may be made of the same material. The present disclosure is not limited thereto.

The support member 200 or the display panel 100 may be disposed on the first adhesive member 310.

The display panel 100 and the porous member 320 may be connected to each other. A portion of the side area of each of the display panel 100 and the porous member 320 may be cut with the laser device 500. Thus, the display apparatus 10 may be formed.

According to an embodiment of the present disclosure, the porous member 320 and the first reinforcing plate 332 are integrally formed with each other. Thus, the rigidity may be improved and thickness may be reduced, whereas as in the embodiment of FIG. 3, it is difficult to block the push impact above a certain force level.

Therefore, the reinforcing plate may be added thereto as shown in the embodiment in FIG. 4. However, when the reinforcing plate is added, the thickness and the non-display area of the device may increase. Therefore, in order to improve the rigidity without adding the reinforcing plate, a coating layer 336 may be formed on a top surface of the first reinforcing plate 332.

The coating layer 336 may be formed by coating an alloy of copper (Cu) and nickel (Ni) on the top surface of the first reinforcing plate 332.

A scheme of forming the coating layer 336 may include melting an alloy of copper (Cu) and nickel (Ni), and plating the melt on the top surface of the first reinforcing plate 332. Alternatively, the scheme may include coating so as to be uniformly applied thereon using a squeegee. The scheme of forming the coating layer 336 is not limited thereto, and may include various schemes.

The copper (Cu) and nickel (Ni) alloy based coating layer 336 disposed on the first reinforcing plate 332 may have excellent thermal conductivity, corrosion resistance, and strength, so that the strength and thermal conductivity of the first reinforcing plate 332 may be increased.

Therefore, the strength may be improved without increasing the thickness of the cushion plate 300, and heat generated from the display panel 100 may be effectively transferred to the porous member 320 for heat-dissipation.

Figure 6:
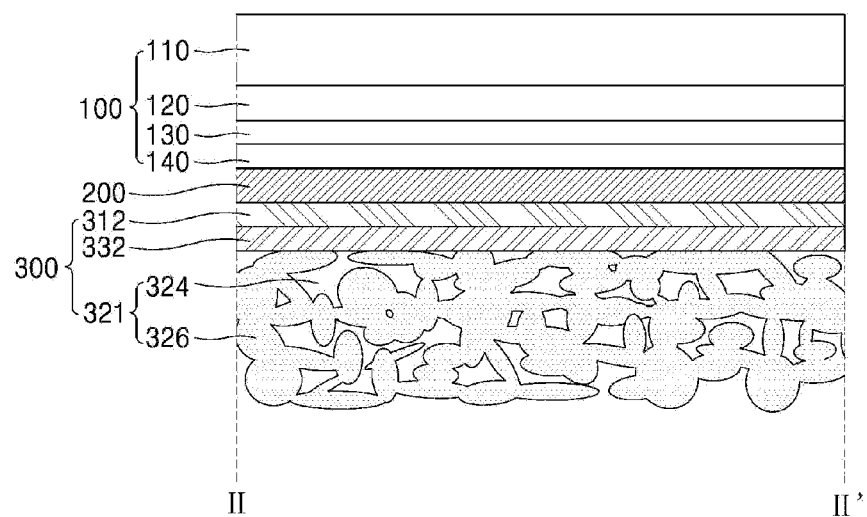

FIG. 6 is a cross-sectional view taken along the line II-If of FIG. 2A, and shows still yet another embodiment of the present disclosure.

Referring to FIG. 6, the cushion plate 300 may include a compressed porous member 321 to improve rigidity.

The compressed porous member 321 may include a compressed metal structure 326 and a plurality of pores 324 disposed inside the compressed metal structure 326.

A vertical pressure may be applied to the porous member 320 of FIG. 5 using a press apparatus or during an assembly process. Thus, the compressed porous member 321 may be obtained.

The compressed porous member 321 has a reduced thickness due to the compression. The porosity of the porous member 321 may be reduced from approximately 74% before the compression to 60% or smaller after the compression. The porosity may refer to an ratio of the area occupied by the plurality of pores to a unit area in the porous member.

As the porosity of the compressed porous member 321 is reduced, the density of the compressed metal structure 326 may be increased to increase the rigidity, and thus to effectively block the push impact.

The compressed porous member 321 has the reduced porosity, and thus may have lowered absorption ability of the instantaneous impact. Accordingly, it is necessary to adjust a compression level in consideration of an environment in which the instantaneous impact and push impact is applied to the display apparatus 10.

The first reinforcing plate 332 may be disposed on the compressed porous member 321 so as to increase the rigidity thereof. The first reinforcing plate 332 may be connected to the compressed porous member 321 using an adhesive member. Alternatively, the porous member 321 and the first reinforcing plate 332 may be integrally formed with each other.

Moreover, the support member 200 and the display panel 100 are disposed on the first reinforcing plate 332. Thus, the display apparatus 10 may be achieved.

A display apparatus and a method for manufacturing the same according to the present disclosure may be described as follows.

According to an embodiment of the present disclosure, a display apparatus comprises a display panel for displaying an image, and a cushion plate disposed under the display panel, wherein the cushion plate includes a porous member, a first reinforcing plate, and a first adhesive member, wherein distal ends of the display panel and the cushion plate coincide or are aligned with each other.

In one implementation of the display apparatus, planar sizes of the display panel and the cushion plate are the same as each other.

In one implementation of the display apparatus, the first reinforcing plate includes stainless steel (SUS) or amorphous alloy.

In one implementation of the display apparatus, the cushion plate further includes a second reinforcing plate disposed on the first reinforcing plate.

In one implementation of the display apparatus, a coating layer made of an alloy of copper (Cu) and nickel (Ni) is disposed on the first reinforcing plate.

In one implementation of the display apparatus, the porous member includes a conductive metal, and a plurality of pores located inside the conductive metal.

In one implementation of the display apparatus, the porous member includes a compressed porous member having a porosity in a range of 60% or smaller, wherein the porosity is defined as a ratio of an area occupied by the plurality of pores to a unit area.

In one implementation of the display apparatus, the cushion plate includes the porous member, the first reinforcing plate, and the first adhesive member sequentially stacked in this order.

In one implementation of the display apparatus, the first reinforcing plate is in direct contact with a top surface of the porous member.

A second aspect of the present disclosure provides a method for manufacturing a display apparatus, the method comprising providing a first reinforcing plate having first and second surfaces opposite to each other, placing a precursor of a porous member containing metal powders on the first surface of the first reinforcing plate, sintering the precursor of the porous member to form a porous member disposed on the first reinforcing plate, placing an adhesive member on the second surface of the first reinforcing plate; placing a display panel on the first adhesive member, and cutting a portion of a side area of each of the display panel and the porous member at once using a laser device.

A scope of protection of the present disclosure should be construed by the scope of the claims, and all technical ideas within the scope equivalent thereto should be construed as being included in the scope of the present disclosure. Although the embodiments of the present disclosure have been described in more detail with reference to the accompanying drawings, the present disclosure is not necessarily limited to these embodiments. The present disclosure may be implemented in various modified manners within the scope not departing from the technical idea of the present disclosure. Accordingly, the embodiments disclosed in the present disclosure are not intended to limit the technical idea of the present disclosure, but to describe the present disclosure. The scope of the technical idea of the present disclosure is not limited by the embodiments. Therefore, it should be understood that the embodiments as described above are illustrative and non-limiting in all respects. The scope of protection of the present disclosure should be interpreted by the claims, and all technical ideas within the scope of the present disclosure should be interpreted as being included in the scope of the present disclosure.

What is claimed is:

1. A display apparatus comprising:
a display panel for displaying an image; and
a cushion plate disposed under the display panel;
wherein the cushion plate includes a porous member, a first reinforcing plate, and a first adhesive member,
wherein a distal end of the display panel and a distal end of the cushion plate coincide or are aligned with each other, and
wherein the cushion plate includes the porous member, the first reinforcing plate, and the first adhesive member sequentially stacked in order.

2. The display apparatus of claim 1, wherein a planar size of the display panel and a planar size of the cushion plate are same as each other.

3. The display apparatus of claim 1, wherein the first reinforcing plate includes stainless steel (SUS) or amorphous alloy.

4. The display apparatus of claim 1, wherein the cushion plate further includes a second reinforcing plate disposed on the first reinforcing plate.

5. The display apparatus of claim 1, wherein a coating layer made of an alloy of copper (Cu) and nickel (Ni) is disposed on the first reinforcing plate.

6. The display apparatus of claim 1, wherein the porous member includes a conductive metal, and is formed with a plurality of pores located inside the conductive metal.

7. The display apparatus of claim 6, wherein the porous member is a compressed porous member having a porosity in a range of 60% or smaller, wherein the porosity is defined as a ratio of an area occupied by the plurality of pores to a unit area.

8. The display apparatus of claim 1, wherein the first reinforcing plate is in direct contact with a top surface of the porous member.

9. A method for manufacturing a display apparatus, the method comprising:
providing a first reinforcing plate having a first surface and a second surface opposite to each other;
placing a precursor of a porous member including metal powders on the first surface of the first reinforcing plate;
sintering the precursor of the porous member to form a porous member disposed on the first reinforcing plate;
placing an adhesive member on the second surface of the first reinforcing plate;
placing a display panel on the first adhesive member; and
cutting a portion of a side area of each of the display panel and the porous member at once using a laser device.

10. A display apparatus comprising:
a display panel including a display area and a non-display area, the display area of the display panel including a pixel array for displaying an image; and
a cushion plate disposed under the display panel, wherein the cushion plate includes:
a porous member formed with a plurality of pores,
at least a first reinforcing plate on the porous member, the first reinforcing plate including a metal material, and
an adhesive member on the first reinforcing plate,
wherein for at least one side of the display apparatus, a side surface of the display panel and a side surface of the cushion plate are aligned with one another.

11. The display apparatus of claim 10, wherein a thickness of the first reinforcing plate is 30 μm or smaller.

12. The display apparatus of claim 10, wherein the first reinforcing plate is a metal plate or a metal sheet including at least one or a combination of stainless steel (SUS), copper (Cu), aluminum (Al), and amorphous alloy.

13. The display apparatus of claim 10, further comprising a support member between the display panel and the cushion plate, wherein a side surface of the support member at the at least one side is aligned with the side surface of the display panel and the side surface of the cushion plate, and wherein the adhesive member is attached to the support member.

14. The display apparatus of claim 13, wherein the supporting member is formed of plastic material including at least one or a combination of PET (polyethylene terephthalate), PC (polycarbonate), and PI (polyimide).

15. The display apparatus of claim 10, wherein the cushion plate further comprises a second reinforcing plate between the porous member and the first reinforcing plate, the second reinforming plate including a metal material.

16. The display apparatus of claim 15, wherein a thickness of the second reinforcing plate is 30 μm or smaller.

17. The display apparatus of claim 10, wherein the first reinforcing plate is integrally formed with the porous member.

18. The display apparatus of claim 10, wherein the cushion plate further includes a coating layer on the first reinforcing plate, wherein the coating layer includes at least one or a combination of copper (Cu) and nickel (Ni).

19. The display apparatus of claim 10, wherein the porous member is a compressed porous member and a porosity of the porous member is 60% or smaller.

* * * * *